United States Patent [19]
Kobayashi

[11] Patent Number: 5,120,634
[45] Date of Patent: Jun. 9, 1992

[54] METHOD FOR FORMING PATTERNED RESIST LAYER ON SEMICONDUCTOR BODY

[75] Inventor: Koichi Kobayashi, Yokohama, Japan

[73] Assignee: Fujitsu Limited, Kawasaki, Japan

[21] Appl. No.: 690,399

[22] Filed: Apr. 25, 1991

Related U.S. Application Data

[63] Continuation of Ser. No. 512,597, Apr. 24, 1991, abandoned, which is a continuation of Ser. No. 342,681, Apr. 25, 1989, abandoned, which is a continuation of Ser. No. 73,357, Jul. 8, 1987, abandoned, which is a continuation of Ser. No. 820,582, Jan. 17, 1986, abandoned, which is a continuation of Ser. No. 636,806, Aug. 3, 1984, abandoned, which is a continuation of Ser. No. 411,317, Aug. 25, 1982, abandoned.

[51] Int. Cl.$^5$ .......................... G03C 5/00; G03F 2/00
[52] U.S. Cl. ..................... 430/330; 430/296; 430/311; 430/313; 430/350
[58] Field of Search ............... 430/296, 311, 313, 330, 430/350; 156/643

[56] References Cited

U.S. PATENT DOCUMENTS

| | | | |
|---|---|---|---|
| 4,241,165 | 12/1980 | Hughes et al. | 430/269 |
| 4,289,842 | 9/1981 | Tan et al. | 430/270 |
| 4,307,176 | 12/1981 | Mochiji et al. | 430/270 |
| 4,339,526 | 7/1982 | Baise et al. | 430/296 |
| 4,348,473 | 9/1982 | Okumura et al. | 430/296 |
| 4,386,152 | 5/1983 | Lai | 430/269 |

FOREIGN PATENT DOCUMENTS 0054412 6/1982 United Kingdom.

OTHER PUBLICATIONS

*IBM Technical Disclosure Bulletin*, "Baking Photoresist to Improve Adhesion", by Pernes et al., vol. 24, No. 1A, Jun. 1981, p. 8.
*Research Disclosure*, "Processing of Photopolymerisable Materials", vol. 156, Apr. 1977, pp. 23–25.

*Primary Examiner*—Charles L. Bowers, Jr.
*Assistant Examiner*—Thorl Chea
*Attorney, Agent, or Firm*—Staas & Halsey

[57] ABSTRACT

An improved method for forming a patterned resist layer on a semiconductor body, after an energy radiation has been projected on a desired region of the resist layer, wherein a layer of negative-working resist on the semiconductor body is heated in an atmosphere which is free from any oxidizing gases, so that post-polymerization of said negative-working resist is substantially accomplished. The exposed and the post-polymerized negative-working resist is then developed. This method provides a high accuracy of the resulting resist patterns and constant thickness of the resist coating remaining in the exposed area after developing. It additionally provides an increased percentage of the thickness of the residual resist coating to the initial coating thickness. Further, it enables straight-line processing of the resists.

9 Claims, 4 Drawing Sheets

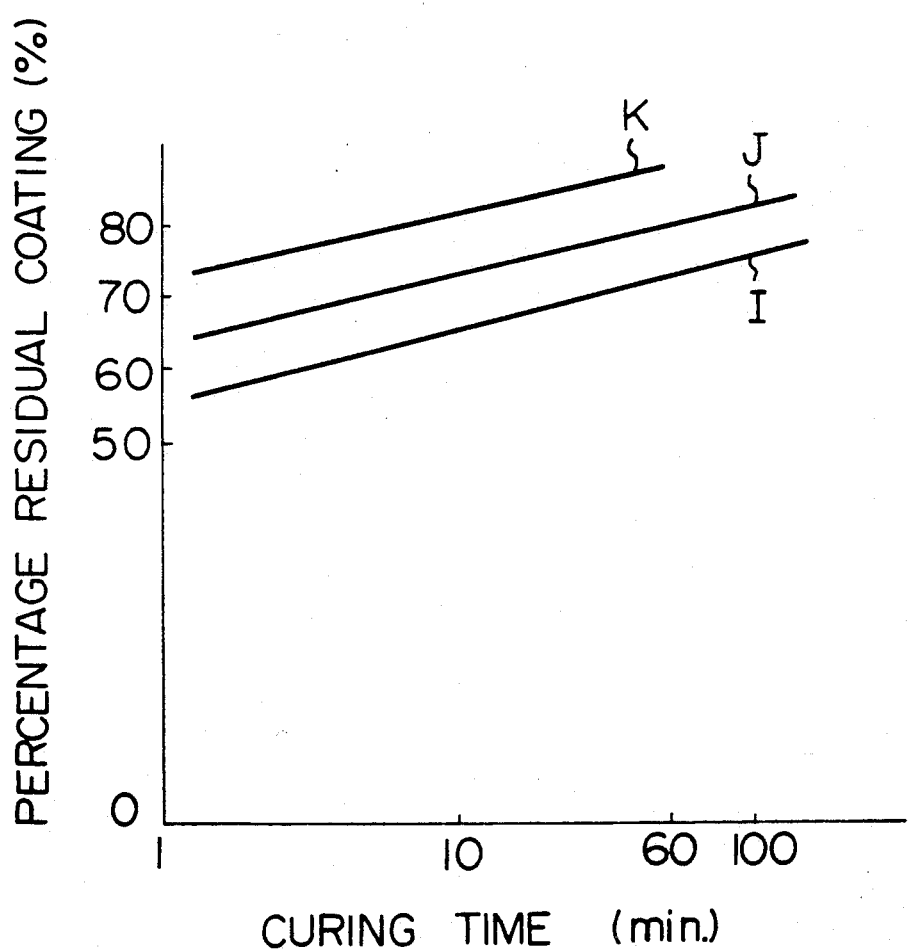

METHOD FOR FORMING PATTERNED RESIST LAYER ON SEMICONDUCTOR BODY

This application is a continuation of application Ser. No. 07/512,597, filed Apr. 24, 1991, now abandoned which is a continuation of U.S. Ser. No. 07/342,681, filed Apr. 25, 1989, now abandoned, which is a continuation of U.S. Ser. No. 07/073,357, filed Jul. 8, 1987, now abandoned, which is a continuation of U.S. Ser. No. 06/820,582, filed Jan. 17, 1986, now abandoned which is a continuation of U.S. Ser. No. 06/636,806, filed Aug. 3, 1984, now abandoned, which is a continuation of U.S. Ser. No. 06/411,317 filed Aug. 25, 1982 now abandoned.

BACKGROUND OF THE INVENTION

1. Field of the Invention

This invention relates to a method for forming a patterned resist layer on a semiconductor body. In other words, this invention relates to a process for the processing of negative-working resists suitable for lithography using energy radiation or a ray, especially, an electron beam, X-rays or an ion beam. Such a method comprises a step of heating a layer of negative-working resist on a semiconductor body in an atmosphere which is free from any oxidizing gases, after exposure to energy radiation and before development. It is particularly useful in the manufacture of semiconductor devices.

2. Description of the Prior Art

Electron-beam exposure systems have been found to be useful in providing controlled line exposure of submicron dimensions. Such dimensions, accompanied by strict tolerances, are essential to the production of integrated circuit chips. The procedure for such production is to expose a resist layer, applied to a suitable substrate or base material, usually a semiconductor, to an electron beam having a width of submicron dimensions. After the resist is developed, the substrate, not protected by the resist, is etched, either by a chemical solution or by a plasma beam.

As is well-known in the art, a variety of negative-working resists are useful for recording an electron beam in the electron-beam exposure devices. This is because they possess high sensitivity to electron beams of conventional voltage and also have submicron resolution capability, thermal stability, and high resistance to etching. After electron-beam exposure, the negative resists are cross-linked in the exposed area through a formation of free radicals and become insoluble in the developer used in the subsequent developing step. During development, the unexposed area of the resists is dissolved in the developer and, therefore, a negative image or resist pattern corresponding to the pattern of the electron-beam exposure is formed on the substrate.

It has been found that many or substantially all of the negative-working resists for electron-beam exposure, such as poly(glycidyl methacrylate) (PGMA), poly(-glycidyl methacrylate-co-ethyl acrylate) (P(GMA-co-EA)), and poly(diallyl orthophthalate) (PDOP), cross-link after the electron-beam exposure while still in the electron-beam exposure device. The additional cross-linking reaction of the negative resists after the electron beam exposure is known in the art as "post-polymerization" and is considered to be caused by the radicals remaining in the resists after completion of the electron beam exposure. The post-polymerization in the exposed area of the resists results in undesirable variation of the width and thickness of the resulting resist patterns.

The post-polymerization of the electron-beam exposed negative-working resists is particularly prone to occur in device chips or parts of resist coated wafers, namely, semiconductor substrates. Resist coated wafers comprise a plurality of device chips. The first chip exposed is contained in the electron-beam exposure device, and therefore maintained under cross-linking conditions, until the electron-beam exposure of the last chip of the wafer is completed. The last chip exposed does not exhibit any, or in any case, exhibits less post-polymerization because the wafer is removed from the exposure device immediately after the completion of exposure of the last chip. The post-polymerization of the resists clearly depends on the residence time in the electron-beam exposure device after electron-beam exposure, and therefore decreases from the first to last electron-beam exposure steps. Actual wafers show relatively wide and thick resist patterns formed on the first chip exposed, and relatively narrow and thin resist patterns formed on the last chip exposed. Further, the percentage of residual coating increases along with the increased residence time of the exposed resists, in the exposure device. The term "percentage of residual coating" used herein means the percentage of the thickness of the coated resist left after electron-beam exposure and developing (residual resist coating), based on the initial thickness of the coated resists.

To solve the problem of the variation of width and thickness, it has heretofore been proposed to further maintain the electron-beam exposed negative resists in a curing chamber appended to the electron-beam exposure device, before developing, in order to intentionally cause a further cross-linking reaction of the exposed and thus cross-linked resists. The curing chamber must be in vacuum or filled with a non-oxidizing atmosphere such as nitrogen gas. This proposal is based on the fact that further or additional cross-linking of the resists in the curing chamber makes variations of the post-polymerization of the resists in the exposure device negligible and thus is effective for attaining a predetermined percentage residual coating.

One difficulty with the above procedure is that the curing time is relatively long, generally, about three to five times the electron-beam exposure time. This means that, to maintain the same speed of processing as without this additional step, three to five wafers must be processed in the curing chamber at once. This procedure is technically troublesome.

SUMMARY OF THE INVENTION

This invention provides an improved process for the processing of negative-working resists for energy radiation exposure, which ensures a high dimensional accuracy of the resulting resist patterns and a constant thickness of the resist coating remaining on the exposed area. It also provides an increased percentage of residual coating. According to the invention, curing of the energy radiation exposed resists can be carried out in a relatively short time in comparison with the prior method. Further, this invention enables straight-line processing of the resists.

More specifically, this invention provides a method for forming a patterned resist layer on a semiconductor body, wherein a layer of negative-working resist on the semiconductor body is heated in an atmosphere which is free from any oxidizing gases, after energy radiation was projected into a desired region of the resist layer, so that post-polymerization of the negative-working resist is substantially accomplished and then the exposed and post-polymerized negative-working resist is developed.

In a first embodiment of the invention, the layer of negative-working resist may be heated in a vacuum.

In a second embodiment of this invention, the atmosphere in which the resist layer is heated after exposure and before development may comprise a nitrogen gas.

In a third embodiment of the invention, the heating may be carried out at a temperature higher than room temperature and lower than 100° C.

The term "energy radiation" used herein is intended to include any energy radiation or rays which are conventionally used in the art, such as an electron beam, X-rays or an ion beam. It is therefore to be noted that while this invention is described hereinafter with regard to exposure with an electron beam, other forms of energy radiation, such as X-rays or an ion beam maybe used as the exposing means.

This invention and its objects and advantages will become more apparent by referring to the accompanying drawings and to the ensuing detailed description of the preferred embodiments, which follows.

BRIEF DESCRIPTION OF THE DRAWINGS

FIG. 6 is a graph of the relation between the curing time and the percentage of residual coating at different curing temperatures in the embodiment of the invention.

DESCRIPTION OF THE PREFERRED EMBODIMENT

Figure 1:
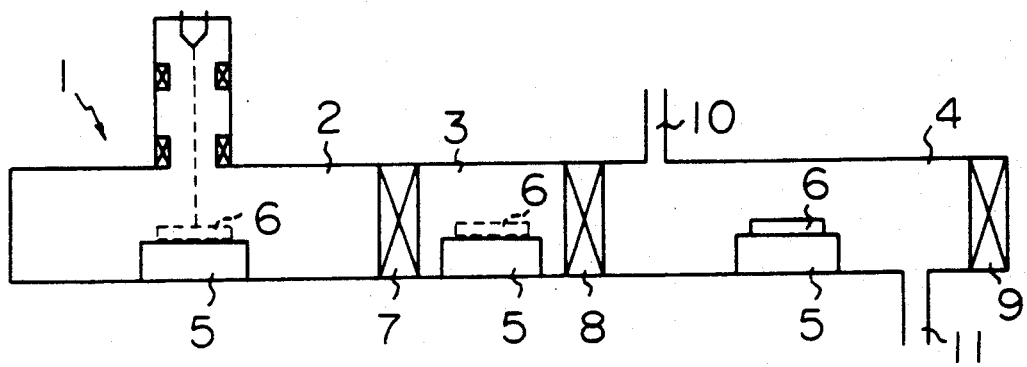
FIG. 1 is a schematic drawing of an electron-beam exposure device for carrying out the method of this invention.

In the embodiment of the invention, it is essential that the electron-beam exposed negative-working resists be heated at an elevated temperature, without exposure to air in the atmosphere, immediately after the electron-beam exposure and before development.

According to this invention, post-polymerization or cross-linking reaction of the resists caused in an electron-beam exposure step is intentionally extended through heating at a high temperature beyond room temperature. The extended cross-linking reaction of the resists is still very short, however, compared with the prior art method.

In order to maintain the electron-beam exposed resists under air-tight conditions, it is proposed that a relatively weak vacuum be introduced to a curing chamber connected to the electron-beam exposure device a non-oxidizing gas may be introduced into the curing chamber to reduce the oxygen concentration in the curing chamber to 1% or less. Examples of non-oxidizing gases useful in the practice of this invention include nitrogen, carbon dioxide, hydrogen, methane, rare gases such as argon and helium, and mixtures thereof. Nitrogen is particularly useful for the purpose of this invention.

As described above, the electron-beam exposed resists have to be heated in the curing chamber at a temperature beyond room temperature (about 20° to 30° C.). It has been found that the temperature should be greater than room temperature but lower than 100° C., preferably, 30° C. to 50° C. Temperatures higher than 100° C. should be avoided since they cause an undesirable thermal cross-linking of the resists, thereby resulting in decreased definition of the resist patterns. It is to be noted that thermal cross-linking is distinguished from the cross-linking intended in the method of this invention.

Heating can be carried out by means of any conventional heating means well-known in the art. Representative heating means useful in this invention include convection heaters, microwave heaters, and infrared lamp heaters. The use of ultraviolet lamps should be avoided, since some types of negative-working resists are sensitive to ultraviolet radiation. If a non-oxidizing atmosphere is used instead of a vacuum, heating may also be carried out by circulating heated non-oxidizing gases in the curing chamber.

This invention can be effectively used for any conventional negative-working resists for electron-beam exposure which are well-known in the art. The invention is preferrably used for PGMA, P(GMA-co-EA), and PDOP, setforth above, copolymers of allylmaleate (CAM), cross-linking electron resists (CER), and copolymers of maleic anhydride and fluoroalkylvinylether (CMF).

It is most important in the practice of this invention that the electron-beam exposed negative resists be maintained in a vacuum or in a non-oxidizing atmosphere. If the exposed resists are exposed, before curing, to the air in the atmosphere even for a moment, it is difficult to attain the desired further cross-linking.

To better understand the invention, the process of formation of a negative resist pattern on a substrate and etching of the substrate, including the process of the invention, is described below.

First, a solution of a selected polymer useful as a negative-working resist for electron-beam exposure is prepared as a resist. Preferred solvents include 2-methoxyethyl acetate, 2-ethoxyethyl acetate, 2-ethoxyethanol, 2-butanone and mixtures of these with 2-propanol or ethanol.

The resist is then coated on a substrate by spin coating, brushing, roll coating, doctor-blade coating, or the like. Any suitable substrate may be used. Particularly preferred substrates include semiconductors such as silicon wafers. Before coating, the substrate is preliminarily washed to improve the adhesive property of the resist thereon.

The resist is then pre-baked. This is conveniently accomplished by baking in an oven, optionally in a vacuum, for example, at 90° C. for 20 minutes. This step is effective in completely removing the solvent remaining in the resist coating. After prebaking, the resist is exposed to an electron beam. The exposure procedures used are well known and no discussion concerning the electron-beam exposure devices and the operation conditions is necessary.

The resist is cured according to the present invention, then developed to remove the unexposed areas. The development can be carried out with the same solvents as set forth above. After development, the negative image or resist pattern is finally formed on the substrate. The formed image or pattern possesses a high dimensional accuracy and a constant thickness of the resist coating remaining in the exposed areas, in addition to thermal stability and high resistance to etching.

Optionally, a post-bake step is included after the electron-beam exposure and development to enhance adhesion of the final resist coating to the areas to be protected, prior to etching.

Etching of the underlying substrate is achieved by application of a chemical solvent or plasma gas to the substrate. The etched substrate can be effectively used to produce semiconductor devices and the like after subsequent processing.

Returning now to the present invention, the invention will now be described in more detail with reference to the accompanying drawings.

FIG. 1 shows one example of the electron-beam exposure device for carrying out the process of this invention. Exposure device 1 comprises exposure chamber 2, intermediate chamber 3, and curing chamber 4. Gates 7 and 8 connect intermediate chamber 3 with exposure chamber 2 and curing chamber 4. Gate 9 connects curing chamber 4 with the outside. Curing chamber 4 has gas inlet 10 and gas outlet 11. Reference numerals 5 refer to a moving stage. Stage 5 carries specimen 6 thereon.

Specimen 6 is a semiconductor wafer and comprises a substrate having coated thereon a negative-working resist for electron-beam exposure. The resist coating (not shown) of specimen 6 is exposed to an electron beam, shown by the vertical dotted line, in electron-beam exposure chamber 2. After exposure, specimen 6 is conveyed on stage 5 through gate 7 to intermediate chamber 3, which has is a vacuum. Gate 7 immediately closes and nitrogen (or other non-oxidizing gas) is introduced to the intermediate chamber 3, raising the pressure to a predetermined lower. At the same time, nitrogen gas heated to a predetermined temperature, for example, about 50° C., is being circulated from gas inlet 10 to gas outlet 11 to fill curing chamber 4 with a free flow of hot gas. Specimen 6 is conveyed from chamber 3 through gate 8 to curing chamber 4, where it undergoes curing or further cross-linking of the resists. The specimen is then removed through gate 9.

Figure 2:
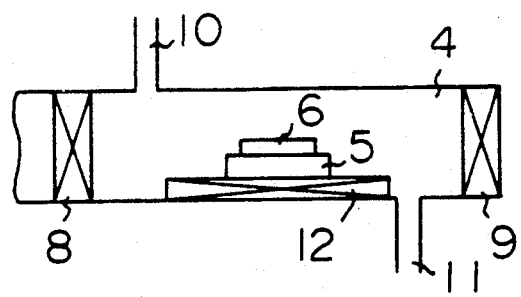
FIG. 2 is a first modification of the curing chamber shown in FIG. 1.

FIG. 2 shows a first modification of the curing chamber of FIG. 1. The modification comprises heating means, convection heater 12,, which allows unheated nitrogen gas to be introduced into the curing chamber 4.

Figure 3:
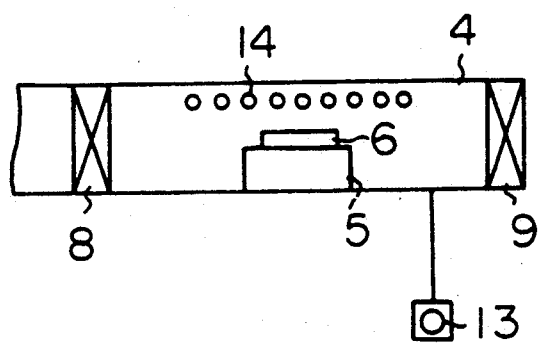
FIG. 3 is a second modification of the curing chamber shown in FIG. 1.

FIG. 3 shows a second modification of the curing chamber of FIG. 1. The modification comprises the rotor 13 used to control the pressure of the curing chamber to a moderate vacuum. Thus, unlike the chambers of FIGS. 1 and 2, no gas is introduced therein and, therefore, no gas inlets or outlets are necessary. For heating, infrared lamps 14 are used. Since curing chamber 4 is maintained under vacuum conditions, no gas need either be introduced into the adjacent intermediate chamber in the previous step.

Figure 4:
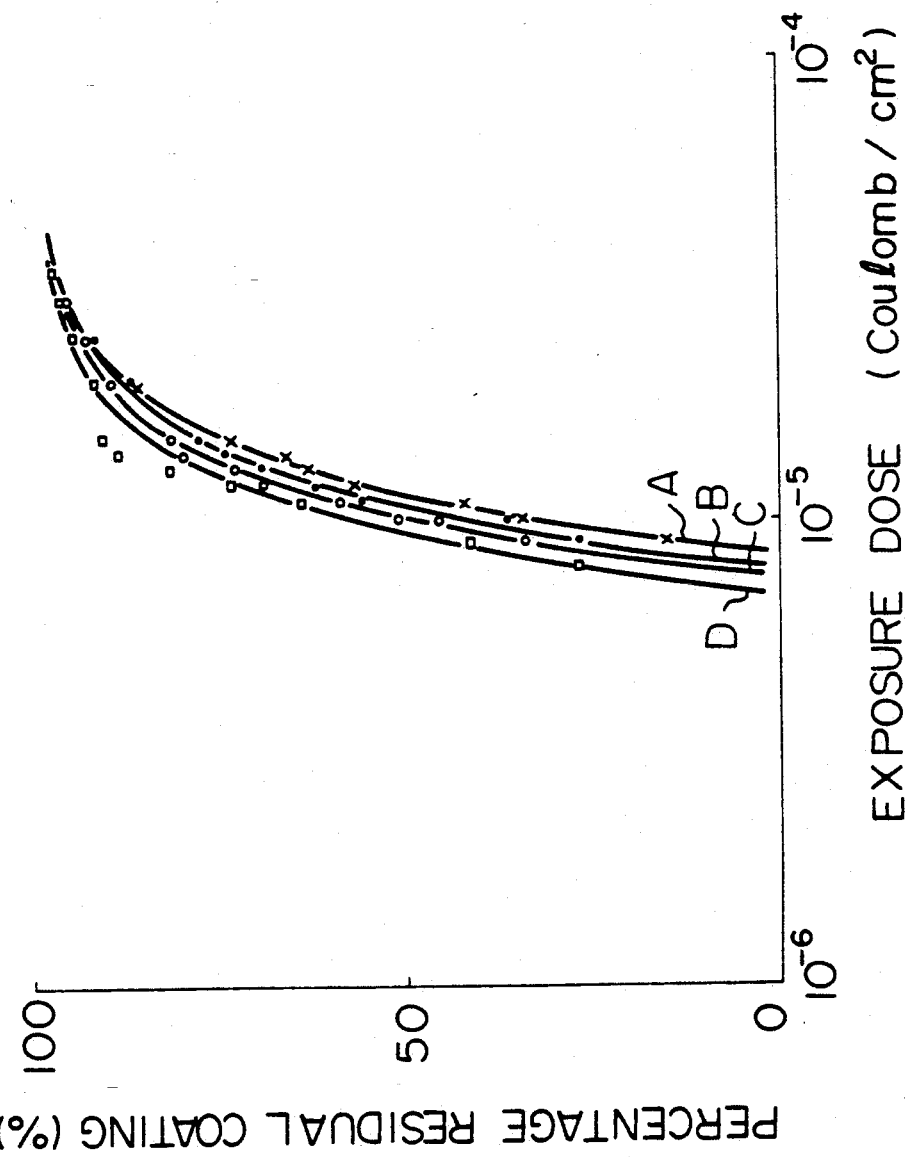
FIG. 4 is a graph of percentage of residual coating and versus exposure does for a prior art method.

FIG. 4 is a prior art graph of the curing time and exposure dose dependence of vs. the percentage of residual coating and finally curing effects. The exposure dose is given on a logarithmic scale.

In order to ascertain the above dependence, silicon substrate was coated with the negative resist PDOP ($M_w$=about 10,000) having a thickness of 1.70 μm, pre-baked at 90° C. for 20 minutes, exposed to an electron beam at different exposure doses, and cured in a nitrogen atmosphere at 23.5° C. for different curing times, namely, 0 min. (Curve A), 3 min. (Curve B), 10 min. (Curve, C), and 30 min. (Curve D). As the graph shows, the percentage of residual coating was increased with an increase of the exposure dose and with an increase in the curing time.

The curing time of the first chip exposed is naturally different from that of the last chip exposed. This fact means that different curing times of the exposed chip of the wafer cause a variation of the percentage of residual coating as well as a variation of the width and thickness of the resulting resist patterns. However, as is clear from FIG. 4, the difference of the percentage of residual coating between the first chip and the last chip can be minimized with an extention of the curing time. This is the reason why the prior method needs a very long curing time, generally, about three to five times the exposure time.

Figure 5:
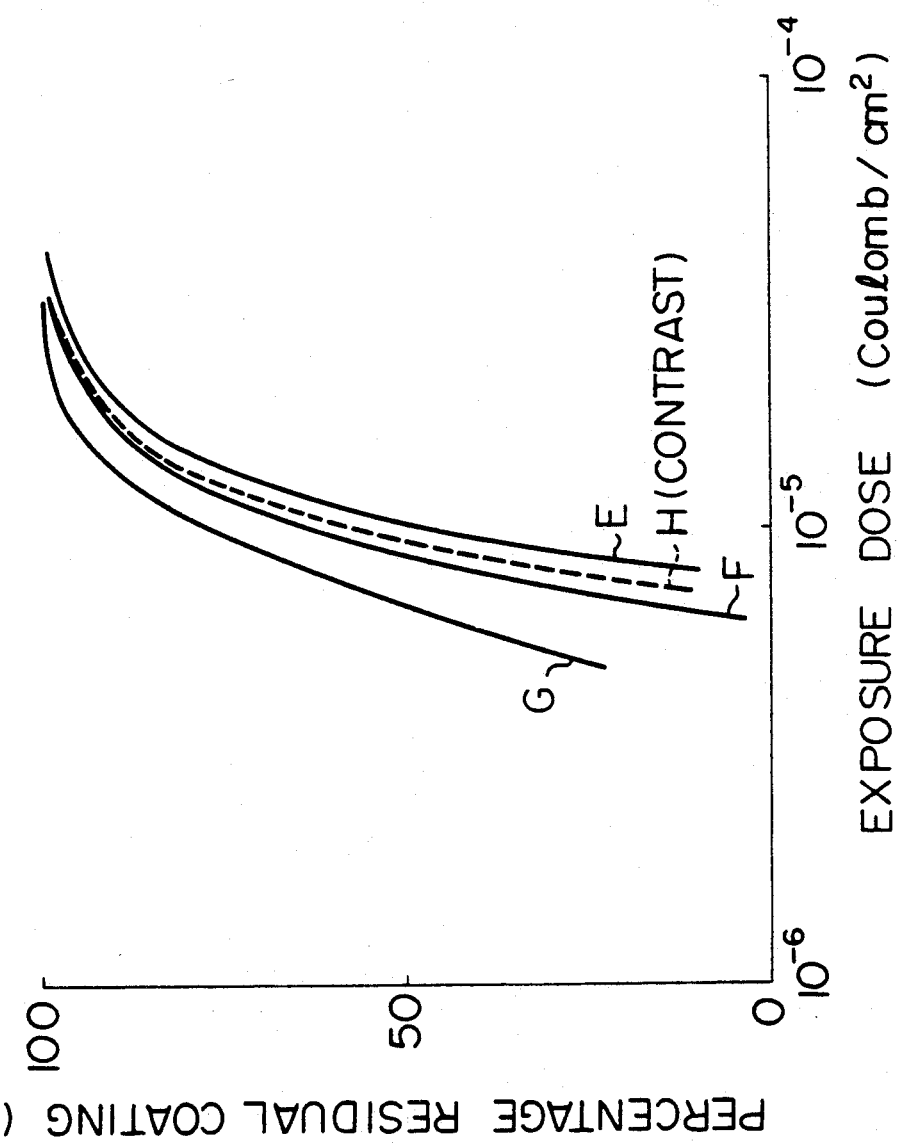
FIG. 5 is a graph of the temperature dependence of the percentage of residual coating and final curing effects in the embodiment of the invention.

FIG. 5 is a graph of the present invention and shows the curing time dependence of the percentage of residual coating and final curing effects. The exposure dose is given on a logarithmic scale, as in FIG. 4.

In order to ascertain the above dependence, the procedure of FIG. 4 was repeated except that curing was done at different temperatures (23.5° C., 30° C. and 60° C.) for ten (10) minutes. Curve E shows a resist cured at 23.5° C. for 10 minutes, curve F at 30° C. for 10 minutes, and curve G at 60° C. for 10 minutes. As the graph shows, the percentage of the residual coating was increased with an increase of the curing temperature.

Further, dotted curve H is a contrast and shows a resist cured at 23.5° C. for 30 minutes. Comparison of this curve with the other curves E, F and G, indicates that heating the exposed negative resist in the curing chamber in accordance with the present invention is more effective than the extension of the curing time in view of achieving an enhanced percentage of residual coating.

Furthermore, similar results were obtained when a moderate vacuum was applied to the curing chamber in place of a nitrogen atmosphere.

The curing effects of the invention may be seen from the graph of FIG. 6 in which the relation between the curing time and the percentage of the residual coating at different curing temperatures, is shown. The graph indicates the results of curing with PDOP ($M_w$=about 10,000) exposed to an electron beam at an exposure dose of about $1.2 \times 10^{-5}$ C/cm². Lines I, J and K indicate the case of a curing temperature of about 23.5° C., 30° C. and 60° C., respectively. The curing time is given on a logarithmic scale.

As is apparent, the percentage of the residual coating increases along with the increase in time after exposure, namely, the curing time. Further, the percentage of the residual coating per unit time increases with the elevation of the temperature of the specimen in the curing chamber, namely, the curing temperature. For example, a curing time of only about 10 minutes a curing temperature of about 30° C., while a curing time of about 60 minutes is needed at a curing temperature of 23.5° C. It is believed that since post-polymerization of the resist is a chemical reaction, a higher temperature increases the polymerization velocity. Therefore, a higher curing temperature accelerates the post-polymerization effect of the resist.

As can be understood from the above description, a reaction velocity of the post-polymerization is accelerated with the elevation of the temperature. Therefore, if a curing temperature is elevated, a curing time can be remarkably shortened. The method of the present invention needs only a curing time which is, at most, equal to or less than the exposure time, while the prior method necessitates a curing time which is at least 3 to 5 times the exposure time, in order to minimize differences in the percentage of the residual coating and pattern size of the resulting resist patterns.

Further, the present invention is effectively applicable not only to electron-beam exposure, but also X-ray exposure in which exposure is carried out by means of a step-and-repeat system in a non-oxidizing atmosphere (including a vacuum), and ion-beam exposure.

I claim:

1. A method for forming a patterned resist layer on a semiconductor body having a layer of negative-working resist thereon, consisting of a polymer or copolymer, comprising the steps of:
    a) irradiating a region of the negative-working resist layer in an exposure chamber in an atmosphere free from any oxidizing gases so as to polymerize irradiated areas of the negative-working resist;
    b) transferring the semiconductor body to a curing chamber without exposing the semiconductor body to an oxidizing atmosphere during the transfer;
    c) heating the layer of negative-working resist on the semiconductor body, after said irradiation step a), in the atmosphere free from any oxidizing gases at a temperature higher than room temperature and lower than that at which the resist polymer or co-polymer evaporates or thermal cross-linking of the negative-working resist in an unexposed area occurs so as to accelerate post-polymerization of the irradiated negative-working resist;
    d) removing the semiconductor body from the curing chamber; and
    e) developing the negative-working resist using a developing solution after the completion of said step d) so as to remove the resist in the unexposed area.

2. A method as set forth in claim 1, wherein the atmosphere free from any oxidizing gases used in said irradiating step a) and said heating step c) is a vacuum.

3. A method as set forth in claim 1, wherein the atmosphere free from any oxidizing gases used in said irradiating step a) and said heating step c) is a nitrogen gas.

4. A method as set forth in claim 1, wherein said heating step c) comprises heating the layer of negative-working resist at a temperature higher than room temperature and lower than 100° C.

5. A method as set forth in claim 2, wherein said heating step c) comprises heating the layer of negative-working resist at a temperature higher than room temperature and lower than 100° C.

6. A method as set forth in claim 3, wherein said heating step c) comprises heating the layer of negative-working resist at a temperature higher than room temperature and lower than 100° C.

7. A method for forming a patterned resist layer on a semiconductor wafer, having a negative-working resist layer thereon, consisting of a polymer or copolymer, in an exposure device having an exposure chamber, an intermediate chamber connected to the exposure chamber and a curing chamber having a gas inlet and outlet and operatively connected to the intermediate chamber, comprising the steps of:
    a) exposing the negative-working resist layer on the semiconductor wafer to an electron beam in the exposure chamber having a non-oxidizing atmosphere or an atmosphere free from any oxidizing gases so as to polymerize the negative-working resist;
    b) maintaining the atmosphere free from any oxidizing gases;
    c) introducing the semiconductor wafer and a non-oxidizing gas into the intermediate chamber after said exposing step a), the non-oxidizing gas raising the pressure in the chamber to a predetermined level;
    d) circulating heated non-oxidizing gas from the inlet to the outlet of the curing chamber to fill the curing chamber, the heated non-oxidizing gas having a temperature higher than room temperature and lower than that at which the negative-working resist evaporates or that at which thermal cross-linking of the negative-working resist in an unexposed area occurs;
    e) conveying the semiconductor wafer into the curing chamber and keeping the semiconductor wafer in the curing chamber for a predetermined time so as to accelerate the post-polymerization of the exposed negative-working resist;
    f) removing the semiconductor wafer from the curing chamber; and
    g) developing the negative-working resist after said step f) using a developing solution so as to remove the resist in the unexposed area.

8. A method for forming a patterned resist layer on a semiconductor wafer, having a negative-working resist layer thereon, consisting of a polymer or copolymer, in an exposure device having an exposure chamber, an intermediate chamber connected to the exposure chamber, and a curing chamber having a gas inlet and outlet and heating means and operatively connected to the intermediate chamber, comprising the steps of:
    a) exposing the negative-working resist layer on the semiconductor wafer to an electron beam in the exposing chamber having a non-oxidizing atmosphere or an atmosphere free from oxidizing gases so as to polymerize the negative-working resist;
    b) maintaining the atmosphere free from oxidizing gases;
    c) introducing the semiconductor wafer and a non-oxidizing gas into the intermediate chamber after said exposing step a), the non-oxidizing gas raising the pressure in the chamber to a predetermined level;
    d) introducing unheated non-oxidizing gas into the curing chamber, the non-oxidizing gas being heated by the heating means to a temperature higher than room temperature and lower than that at which the negative-working resist polymer or copolymer evaporates or that at which thermal cross-linking of the negative-working resist in an unexposed area occurs;
    e) conveying the semiconductor wafer into the curing chamber and keeping the semiconductor wafer in the curing chamber for a predetermined time so as to accelerate post-polymerization of the exposed negative-working resist;
    f) removing the semiconductor wafer from the curing chamber; and g) developing the negative-working resist after said step f) by using a developing solution so as to remove the resist in the unexposed area.

9. A method for forming a patterned resist layer on a semiconductor wafer, having a negative-working resist layer, consisting of a polymer or copolymer, thereon, in an exposure device having an exposure chamber, an intermediate chamber connected to the exposure chamber and a curing chamber having pressure control means and heating means and operatively connected to the intermediate chamber, comprising the steps of:

a) exposing the negative-working resist layer on the semiconductor wafer to an electron beam in the exposure chamber, having an atmosphere free from oxidizing gases so as to polymerize the negative-working resist;

b) maintaining the atmosphere free from oxidizing gases;

c) conveying the semiconductor wafer into the intermediate chamber having an atmosphere free from oxidizing gasses after said exposing step a), and introducing a non-oxidizing gas for raising the pressure in the chamber to a predetermined level;

d) conveying the semiconductor wafer into the curing chamber and keeping the semiconductor wafer in the curing chamber while maintaining the non-oxidizing gas, for a time less than or equal to the predetermined exposure time at a temperature higher than room temperature and less than that at which thermal cross-linking of the negative-working resist in an unexposed area of the negative-working layer occurs, so as to accelerate post-polymerization of the exposed negative-working resist;

e) removing the semiconductor wafer from the curing chamber; and f) developing the negative-working resist after said step e) using a developing solution so as to remove the negative-working resist in the unexposed area.

* * * * *

UNITED STATES PATENT AND TRADEMARK OFFICE
CERTIFICATE OF CORRECTION

PATENT NO. : 5,120,634
DATED : JUNE 9, 1992
INVENTOR(S) : KOICHI KOBAYASHI

It is certified that error appears in the above-identified patent and that said Letters Patent is hereby corrected as shown below:

TITLE PAGE [63] line 1, "Apr. 24, 1991," should be --Apr. 24, 1990,--.

Col. 1, line 6, "Apr. 24, 1991," should be --Apr. 24, 1990,--.

Col. 5, line 38, "lower." should be --level.--;
line 48, "12,," should be --12,--;
line 61, "of vs. the" should be --vs. the--.

Signed and Sealed this

Fourteenth Day of September, 1993

Attest:

BRUCE LEHMAN

Attesting Officer     Commissioner of Patents and Trademarks